United States Patent
Sim et al.

(10) Patent No.: US 10,553,362 B1
(45) Date of Patent: Feb. 4, 2020

(54) MULTILAYER CERAMIC ELECTRONIC COMPONENT AND INTERPOSER INCLUDED THEREIN

(71) Applicant: SAMSUNG ELECTRO-MECHANICS CO., LTD., Suwon-si, Gyeonggi-do (KR)

(72) Inventors: Won Chul Sim, Suwon-si (KR); Ho Yoon Kim, Suwon-si (KR); Woo Chul Shin, Suwon-si (KR); Sang Soo Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/213,749

(22) Filed: Dec. 7, 2018

(30) Foreign Application Priority Data

Oct. 17, 2018 (KR) ........................ 10-2018-0123954

(51) Int. Cl.
| | |
|---|---|
| *H01G 4/228* | (2006.01) |
| *H01G 2/06* | (2006.01) |
| *H05K 1/18* | (2006.01) |
| *H01G 4/30* | (2006.01) |
| *H01G 4/12* | (2006.01) |
| *H01G 4/008* | (2006.01) |

(52) U.S. Cl.
CPC .............. *H01G 4/30* (2013.01); *H01G 2/065* (2013.01); *H01G 4/008* (2013.01); *H01G 4/1227* (2013.01); *H01G 4/228* (2013.01); *H05K 1/181* (2013.01); *H05K 2201/10015* (2013.01); *H05K 2201/10378* (2013.01)

(58) Field of Classification Search
CPC ......... H05K 2201/10378; H01G 2/065; H01G 2/06; H01G 4/228; H01G 4/30
See application file for complete search history.

(56) References Cited

U.S. PATENT DOCUMENTS

| | | | |
|---|---|---|---|
| 2014/0016242 A1 | 1/2014 | Hattori et al. | |
| 2014/0022689 A1* | 1/2014 | Kwag | H01G 4/232 361/301.4 |

(Continued)

FOREIGN PATENT DOCUMENTS

| | | | |
|---|---|---|---|
| JP | 08018285 A | * | 1/1996 |
| JP | 2012-204572 A | | 10/2012 |

(Continued)

*Primary Examiner* — David M Sinclair
(74) *Attorney, Agent, or Firm* — Morgan, Lewis & Bockius LLP

(57) ABSTRACT

A multilayer ceramic electronic component includes a ceramic body including dielectric layers and first and second internal electrodes, first and second external electrodes disposed on first and second external surfaces of the ceramic body, and an interposer including an insulating body and first and second terminal electrodes. (B1+B2)/2 is greater than or equal to 10 micrometers (μm) and less than C/2, and C is greater than (B1+B2) and less than or equal to 80 μm, in which B1 is a thickness of an upper portion, of each of the first and second terminal electrodes, disposed above the insulating body, B2 is a thickness of a lower portion, of each of the first and second terminal electrodes, disposed below the insulating body, and C is a thickness of the interposer.

11 Claims, 8 Drawing Sheets

(56) References Cited

U.S. PATENT DOCUMENTS

| | | | |
|---|---|---|---|
| 2014/0284089 A1* | 9/2014 | Hattori | H05K 1/141 174/258 |
| 2015/0206661 A1* | 7/2015 | Fujimura et al. | H05K 1/141 174/258 |
| 2015/0270068 A1* | 9/2015 | Hattori | H01G 4/30 361/301.4 |
| 2016/0227651 A1* | 8/2016 | Mori | H05K 1/181 |
| 2017/0171980 A1 | 6/2017 | Hattori et al. | |
| 2017/0359900 A1* | 12/2017 | Sakamoto | H01G 4/30 |
| 2018/0158608 A1* | 6/2018 | Fujita et al. | H01G 4/30 361/301.4 |

FOREIGN PATENT DOCUMENTS

| | | |
|---|---|---|
| JP | 2016-105453 A | 6/2016 |
| KR | 10-2017-0028610 A | 3/2017 |

* cited by examiner

MULTILAYER CERAMIC ELECTRONIC COMPONENT AND INTERPOSER INCLUDED THEREIN

CROSS-REFERENCE TO RELATED APPLICATION(S)

This application claims benefit of priority to Korean Patent Application No. 10-2018-0123954 filed on Oct. 17, 2018 in the Korean Intellectual Property Office, the disclosure of which is incorporated herein by reference in its entirety.

TECHNICAL FIELD

The present disclosure relates to a multilayer ceramic electronic component and an interposer included therein.

BACKGROUND

Multilayer ceramic electronic components are widely used as IT components of computers, PDAs, mobile phones, and the like due to advantages thereof such as compactness, high capacitance, and ease of mounting. Also, the multilayer ceramic electronic components are widely used as electric components due to high reliability and high strength characteristics thereof.

A multilayer ceramic electronic component may cause acoustic noise due to an internal piezoelectric effect. Such acoustic noise may propagate to a board to cause noise that can be perceived by a person and to cause malfunction of nearby sensors.

In recent years, as multilayer ceramic electronic components have been used in wearable electronic devices or ultra-small electronic devices, a structure taking thinning into consideration is also required.

SUMMARY

An aspect of the present disclosure is to provide a multilayer ceramic electronic component reducing acoustic noise and an interposer included in the multilayer ceramic electronic component.

According to an aspect of the present disclosure, a multilayer ceramic electronic component includes a ceramic body including dielectric layers and first and second internal electrodes laminated with each of the dielectric layers interposed therebetween and alternately exposed to first and second external surfaces of the ceramic body, first and second external electrodes disposed on the first and second external surfaces of the ceramic body to be connected to the first and second internal electrodes, respectively, and an interposer, including an insulating body, disposed below the ceramic body, and first and second terminal electrodes having an upper portion disposed between the first and second external electrodes and the insulating body and a lower portion disposed on a lower surface of the insulating body, respectively. $(B1+B2)/2$ is greater than or equal to 10 micrometers ($\mu$m) and less than $C/2$, while C is greater than $(B1+B2)$ and less than or equal to 80 $\mu$m, in which B1 a thickness of an upper portion, of each of the first and second terminal electrodes, disposed above the insulating body, B2 is a thickness of a lower portion, of each of the first and second terminal electrodes, disposed below the insulating body, and C is a thickness of the interposer.

According to an aspect of the present disclosure, an interposer includes an insulating body, first and second upper electrodes disposed on an upper side of the insulating body, and first and second lower electrodes disposed on a lower surface of the insulating body. B is $(B1+B2)/2$ and is greater than or equal to 10 micrometers ($\mu$m) and less than or equal to 20 $\mu$m and A is greater than or equal to 15 $\mu$m and less than or equal to 60 $\mu$m, in which A is a thickness of the insulating body, B1 is a thickness of each of the first and second upper electrodes, and B2 is a thickness of each of the first and second lower electrodes.

According to an aspect of the present disclosure, a multilayer ceramic electronic component includes: a ceramic body including dielectric layers and first and second internal electrodes laminated with each of the dielectric layers interposed therebetween and alternately exposed to first and second external surfaces of the ceramic body; first and second external electrodes disposed on the first and second external surfaces of the ceramic body to be connected to the first and second internal electrodes, respectively; and an interposer, including an insulating body, disposed below the ceramic body, and first and second terminal electrodes having an upper portion disposed between the insulating body and the first and second external electrodes and a lower portion disposed on a lower surface of the insulating body, respectively. A is greater than or equal to $(100 \mu m - 4.5B)$ and less than or equal to $(100 \mu m - 3.5B)$, in which A is a thickness of the insulating body and B is an average thickness of the upper portion of each of the first and second terminal electrodes and the lower portion of each of the first and second terminal electrodes.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1A:
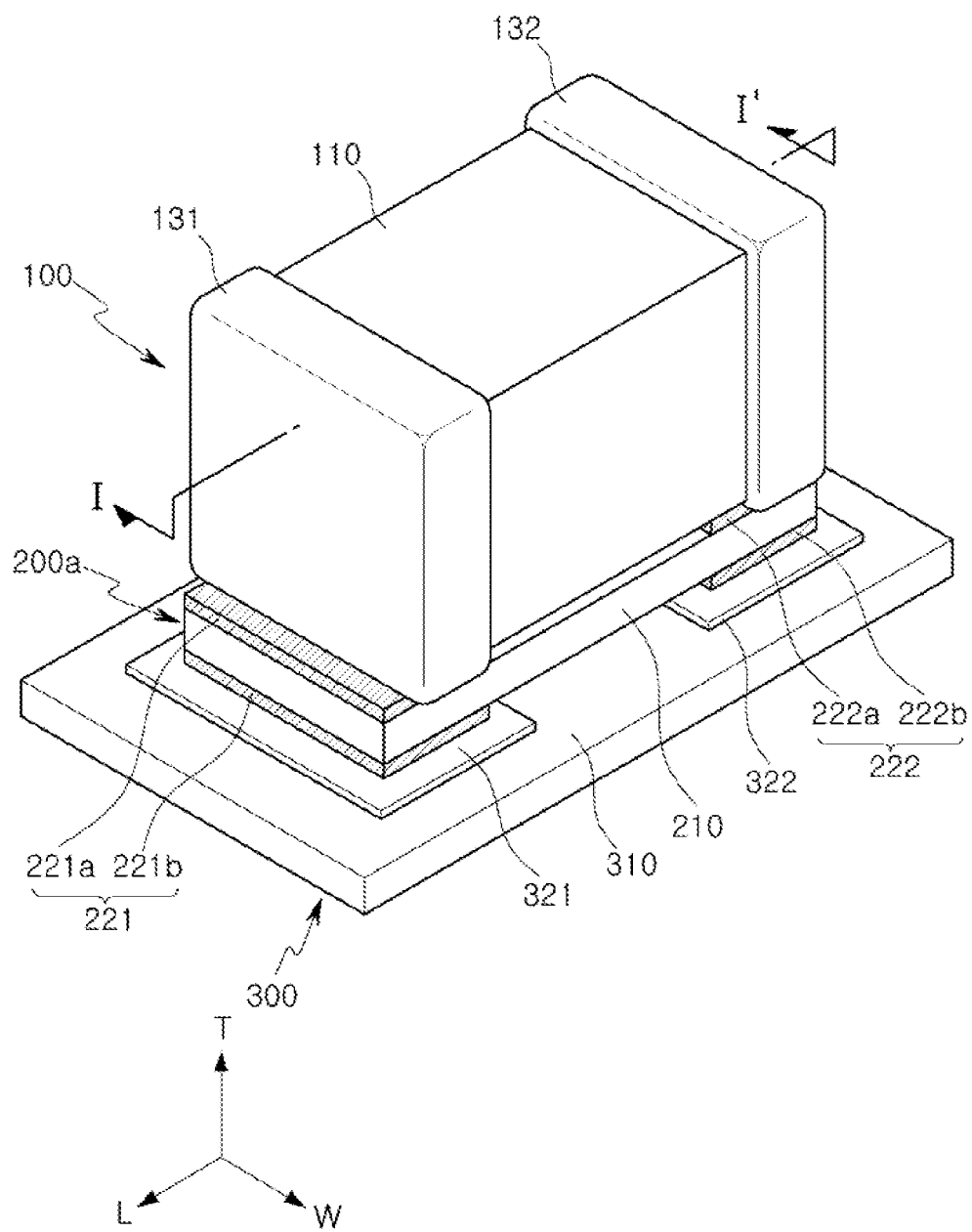
FIG. 1A is a perspective view of a multilayer ceramic electronic component according to an exemplary embodiment in the present disclosure.

Hereinafter, embodiments of the present disclosure will be described as follows with reference to the attached drawings. The present disclosure may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Through the specification, in addition, unless explicitly described to the contrary, the word "comprise," and variations such as "comprises" or "comprising" will be understood to imply the inclusion of stated elements but not the exclusion of any other elements.

Directions of a hexahedral ceramic body will be defined in order to clearly describe an embodiment of the invention. L, W and T shown throughout the drawings refer to a length direction, a width direction, and a thickness direction, respectively. Here, the thickness direction may be the same as a direction in which dielectric layers are laminated.

Hereinafter, a multilayer ceramic electronic component according to an exemplary embodiment in the present disclosure will be described. In detail, a multilayer ceramic capacitor will be described. However, the present disclosure is not limited thereto.

Figure 1B:
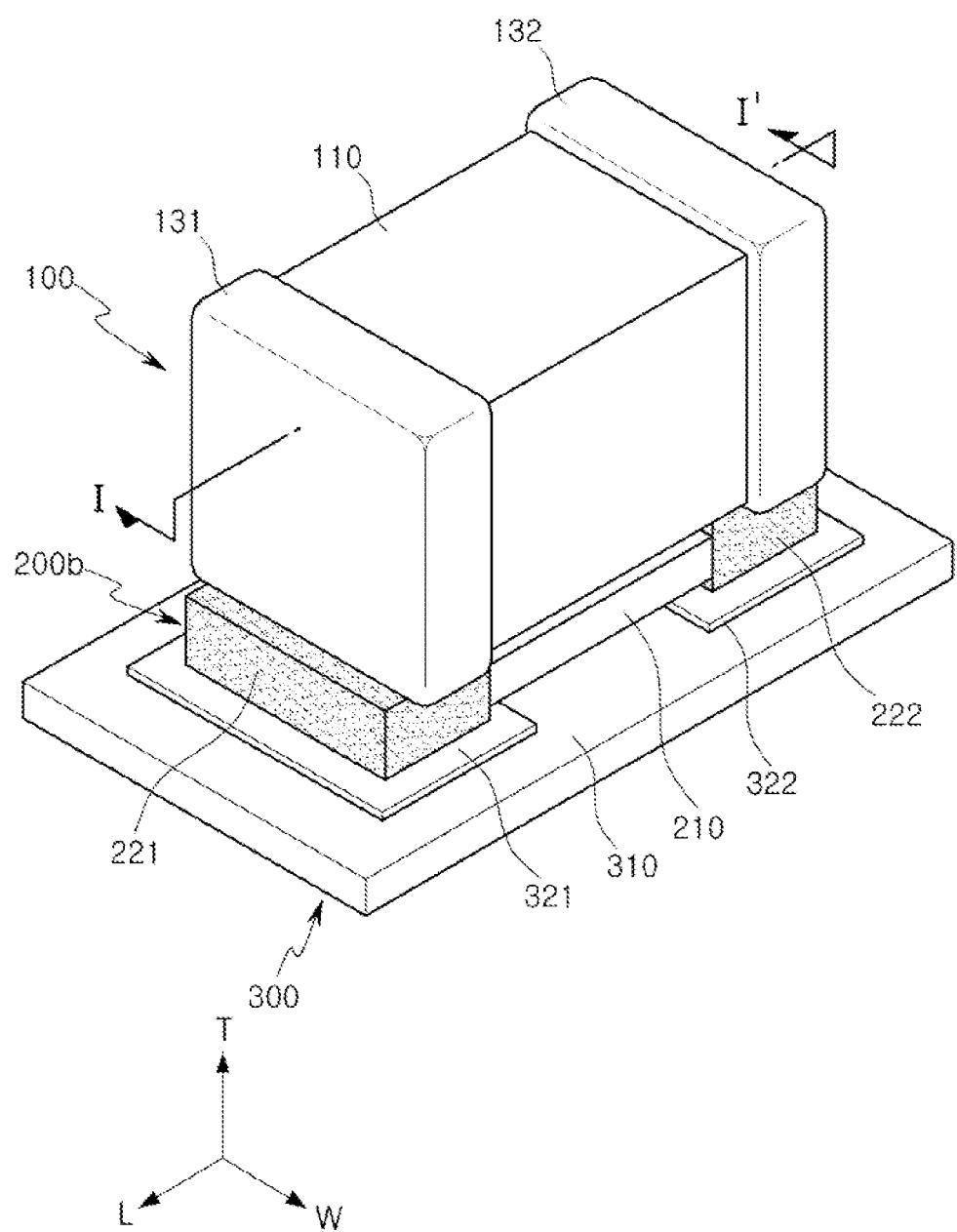
FIG. 1B is a perspective view illustrating a modified structure of a terminal electrode of a multilayer ceramic electronic component according to an exemplary embodiment in the present disclosure.
Figure 2:
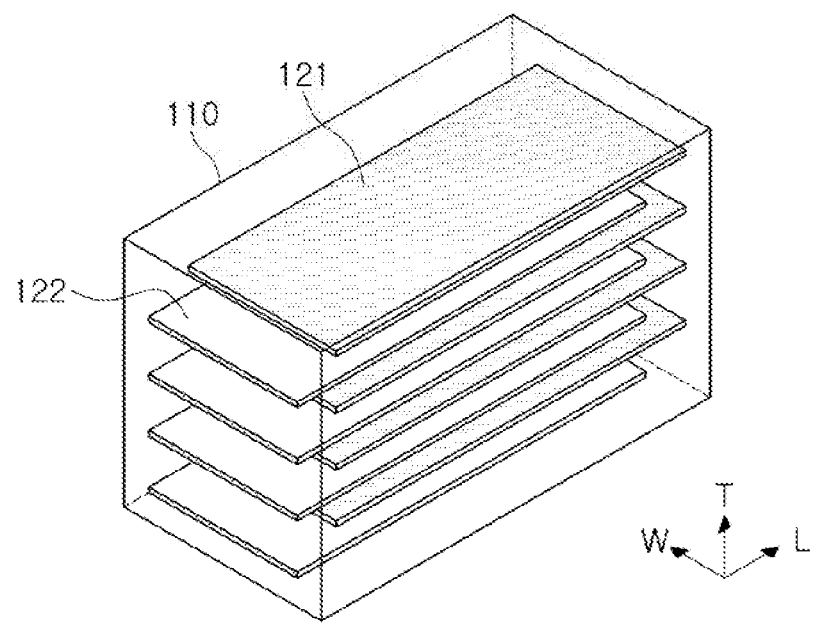
FIG. 2 is a perspective view illustrating an internal structure of a ceramic body of a multilayer ceramic electronic component according to an exemplary embodiment in the present disclosure.
Figure 3A:
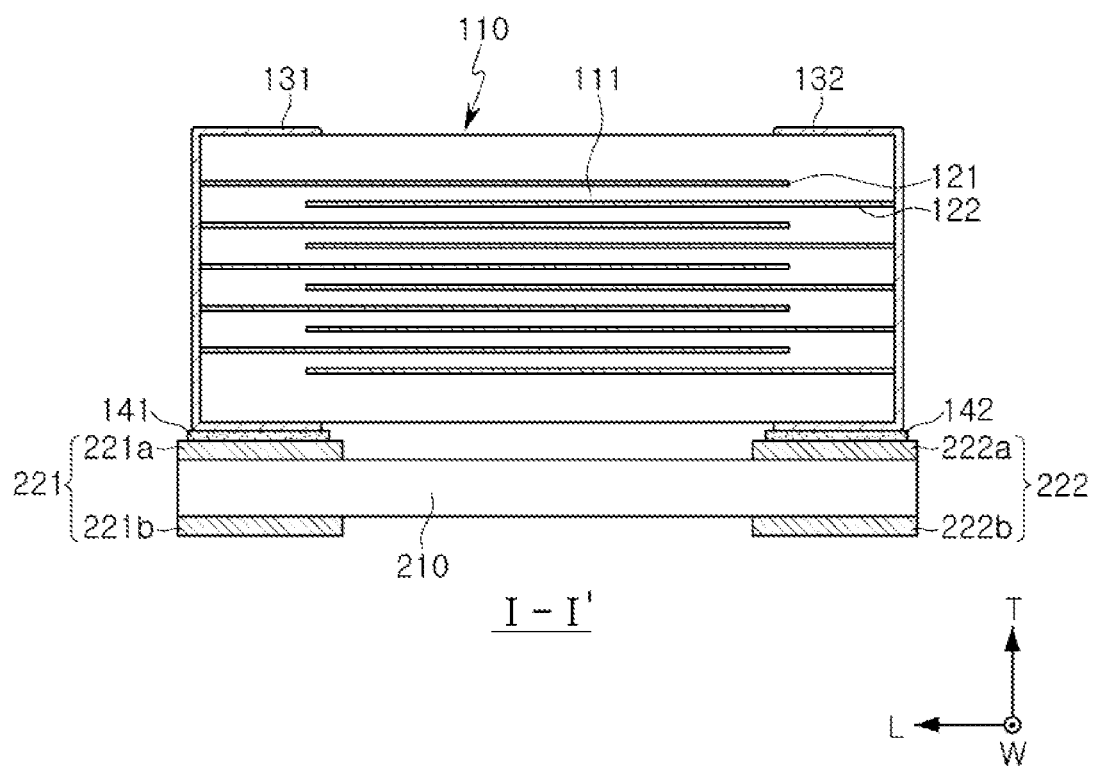
FIG. 3A is a side view of a multilayer ceramic electronic component according to an exemplary embodiment in the present disclosure.

FIG. 1A is a perspective view of a multilayer ceramic electronic component according to an exemplary embodiment in the present disclosure, and FIG. 1B is a perspective view illustrating a modified structure of a terminal electrode of a multilayer ceramic electronic component according to an exemplary embodiment in the present disclosure. FIG. 2 is a perspective view illustrating an internal structure of a ceramic body of a multilayer ceramic electronic component according to an exemplary embodiment in the present disclosure. FIG. 3A is a side view of a multilayer ceramic electronic component according to an exemplary embodiment in the present disclosure.

Referring to FIGS. 1A and 3A, a multilayer ceramic electronic component 100 according to an exemplary embodiment includes a multilayer ceramic capacitor. The multilayer ceramic capacitor includes a ceramic body 110 and first and second external electrodes 131 and 132.

The ceramic body 110 may be formed of a hexahedron having both side surfaces in a length direction L, both side surfaces in a width direction W, and both side surfaces in a thickness direction T. The ceramic body 110 may be formed by laminating a plurality of dielectric layers 111 in the thickness direction T and then sintering the plurality of dielectric layers 111. A shape and a dimension of the ceramic body 110 and the number of laminated dielectric layers 111 (one or more) is not limited to those of an example illustrated in the exemplary embodiment.

The plurality of dielectric layers 111 disposed in the ceramic body 110 may be in a sintered state, and adjacent dielectric layers 111 may be integrated with each other so that boundaries therebetween are not readily apparent without using a scanning electron microscope (SEM).

For example, the ceramic body 110 may have a round shape with eight corners in a hexahedron. Accordingly, durability and reliability of the ceramic body 110 may be improved, and structural reliability of the first and second external electrodes 131 and 132 at the corners may be improved.

A thickness of the dielectric layer 111 may be arbitrarily changed in accordance with a capacitance design of the multilayer ceramic electronic component 100, and the dielectric layer 111 may contain ceramic powder particles having a high dielectric constant, such as barium titanate ($BaTiO_3$)-based powder particles or strontium titanate ($SrTiO_3$)-based powder particles. However, a material thereof is not limited thereto. Further, various ceramic additives, an organic solvent, a plasticizer, a binder, a dispersant, and the like, may be added to the ceramic powder particles, according to the object of the present disclosure.

An average particle size of a ceramic powder used to form the dielectric layer 111 is not limited and may be controlled to achieve the object of the present disclosure. For example, the average particle size may be controlled to be 400 nanometers (nm) or less. Accordingly, the multilayer ceramic electronic component 100 according to an exemplary embodiment may be used as a component requiring a large size and high capacitance as in the case of IT components.

For example, the dielectric layer 111 may be formed by applying slurry containing powder particles such as a barium titanate ($BaTiO_3$)-based powder to carrier films and drying the applied slurry to prepare a plurality of ceramic sheets. The ceramic sheet may be manufactured by mixing the ceramic powder particles, a binder, and a solvent to prepare the slurry and manufacturing the prepared slurry in a sheet shape having a thickness of several micrometers (μm) by a doctor blade method, but the manufacturing method of the ceramic sheet is not limited thereto.

The first and second external electrodes 131 and 132 may be disposed on first and second external surfaces (for example, one external surface and the other external surfaces in the length direction) of the ceramic body 110 to be connected to first and second internal electrodes, respectively. Also the first and second external electrodes 131 and 132 may be configured to electrically connect the first and second internal electrode to a board.

For example, the first and second external electrodes 131 and 132 may be formed of one of copper (Cu), palladium (Pd), platinum (Pt), gold (Au), silver (Ag), and lead (Pb), or alloys thereof.

For example, the first and second external electrodes 131 and 132 may include first and second electrode layers containing copper (Cu) or nickel (Ni) and first and second plating layers disposed on the first and second electrode layers and containing nickel (Ni) and tin (Sn).

The first and second electrode layers may be formed by dipping the ceramic body 110 in a paste containing a metal ingredient or printing a conductive paste containing a conductive metal on at least one surface of the ceramic body 110 in the thickness direction T. Alternatively, the first and second electrode layers may be formed by a sheet transfer method or a pad transfer method.

The first and second plating layers may be formed by a sputtering method or an electric deposition method, but a forming method thereof is not limited thereto.

Referring to FIG. 2, the ceramic body 110 includes first and second internal electrodes 121 and 122 and a plurality of dielectric layers.

The first and second internal electrodes 121 and 122 are alternately laminated with each of the dielectric layers disposed therebetween to be exposed to a first external surface and a second external surface of the ceramic body 110 (for example, one external surface and the other external surface of the ceramic body 110 in the length direction) to have polarities different from each other.

The first internal electrodes 121 and the second internal electrodes 122 may be formed in a laminating direction of the dielectric layers to be alternately exposed to one external surface and the other external surface of the ceramic body 110 in the length direction L of the ceramic body 110 and may be formed of a conductive paste containing a conductive metal printed thereon. The first internal electrodes 121 and the second internal electrodes 122 may be electrically insulated from each other by each of the dielectric layers disposed therebetween.

For example, the first and second internal electrodes 121 and 122 may be electrically connected to the first and second external electrodes 131 and 132 disposed on both external surfaces of the ceramic body 110 in the length direction L of the ceramic body 110 through portions alternately exposed to both external surfaces of the ceramic body 110 in the length direction L of the ceramic body 110, respectively.

For example, the first and second internal electrodes 121 and 122 by formed by a conductive paste for an internal electrode having an average particle size of 0.1 to 0.2 μm and containing 40 wt % to 50 wt % of conductive metal powder particles, but the conductive paste thereof is not limited thereto.

The conductive paste for an internal electrode may be applied to the ceramic sheets by a printing method, or the like, to form internal electrode patterns. A method of printing the conductive paste may be a screen printing method, a gravure printing method, or the like, but is not limited thereto. Two hundred or three hundred ceramic sheets on which the internal electrode pattern is printed may be laminated, pressed, and sintered to manufacture the ceramic body 110.

Accordingly, when a voltage is applied to the first and second eternal electrodes 131 and 132 opposing each other, charges are accumulated between the first and second internal electrodes 121 and 122. In this case, capacitance of the multilayer ceramic electronic component 100 is in proportion to an area of a region in which the first and second internal electrodes 121 and 122 overlap each other.

For example, when the overlapping area of the first and second internal electrodes 121 and 122 is significantly increased, capacitance of even a capacitor having the same size may be significantly increased.

Thicknesses of the first and second internal electrodes 121 and 122 may be determined depending on use thereof. For example, each of the thicknesses of the first and second internal electrodes 121 and 122 may be 0.4 μm or less. In addition, the number of the first and second internal electrodes 121 and 122 laminated may be 400 or more. Thus, the multilayer ceramic electronic component 100 may be used as an IT component requiring compactness and high capacitance.

Since a thickness of a dielectric layer corresponds to a distance between the first and second internal electrodes 121 and 122, the capacitance of the multilayer ceramic electronic component 100 may be increased as the thickness of the dielectric layer is decreased.

The first and second internal electrodes 121 and 122 may be formed of one of nickel (Ni), copper (Cu), palladium (Pd), silver (Ag), lead (Pb), and platinum (Pt), or alloys thereof, but a material thereof is not limited thereto.

Withstand voltage characteristics of the ceramic body 110 may be improved as the distance between the first and second internal electrodes 121 and 122 is increased.

In the case in which the multilayer ceramic electronic component 100 is required to have withstand voltage characteristics that are as high as those of an electric component, the multilayer ceramic electronic component 100 may be designed in such a manner that an average thickness of dielectric layers may exceed twice an average thickness of the first and second internal electrodes 121 and 122. Accordingly, the multilayer ceramic electronic component 100 may have high withstand voltage characteristics to be used as an electric component.

Durability (for example, flexural strength) of the ceramic body 110 may have improved reliability when a width of the ceramic body 110 exceeds 0.5 times a thickness thereof.

Referring to FIG. 1A, the multilayer ceramic electronic component according to an exemplary embodiment may include an interposer 200a and may further include a board 300 and first and second electrode pads 321 and 322 disposed between the board 300 and the interposer 200a. The board 300 may include a base member 310. Referring to FIG. 1B, the multilayer ceramic electronic component according to an exemplary embodiment may include interposer 200b and may further include a board 300 and first and second electrode pads 321 and 322 disposed between the board 300 and the interposer 200b. The board 300 may include a base member 310.

Each of the interposers 200a and 200b may include an insulating body 210 and first and second terminal electrodes 221 and 222 and may attenuate acoustic noise which may be generated in the ceramic body 110 while suppressing transmission of the acoustic noise to the board 300 below a respective one of the interposers 200a and 200b. Thus, the acoustic noise may be reduced.

The insulating body 210 is disposed below the ceramic body 110. For example, the insulating body 210 may be formed using the same material as an insulating layer as a printed circuit board (PCB) and may be implemented to have the same high Young's modulus as alumina to effectively reduce the acoustic noise of the ceramic body 110.

Portions of the first and second terminal electrodes 221 and 222 may be disposed between the first and second external electrodes 131 and 132 and the insulating body 210, and other portions of the first and second terminal electrodes 221 and 222 may be disposed on the lower surface of the insulating body 210.

Referring to FIG. 1B, each of the first and second terminal electrodes 221 and 222 may be designed as a single terminal electrode. For example, the first and second terminal electrodes 221 and 222 may additionally include side portions to cover one side and the other side of the insulating body 210 in the length direction, respectively, and to connect the respective upper and lower portions to each other.

Referring to FIG. 1A, the first and second terminal electrodes 221 and 222 may include first and second upper electrodes 221a and 222a disposed between the first and second external electrodes 131 and 132 and the insulating body 210 and first and second lower electrodes 221b and 222b disposed below the insulating body 210 and electrically connected to the first and second upper electrodes 221a and 222a, respectively.

The one side and the other side of the insulating body 210 in the length direction may not be covered with the first and second terminal electrodes 221 and 222, but are not limited thereto. For example, the first and second upper electrodes 221a and 222a and the first and second lower electrodes 221b and 222b may be connected to each other through the one side and the other side of the insulating body 210 in the length direction.

Referring to FIG. 3A, a multilayer ceramic electronic component according to an exemplary embodiment may further include a first solder 141 having at least a portion disposed between a first upper electrode 221a and a first external electrode 131 and a second solder 142 having at least a portion between a second upper electrode 222a and the second external electrode 132.

The multilayer ceramic electronic component may be mounted by mounting solders disposed at one side and the other side of an insulating body 210 in a length direction.

The mounting solders may act as a path along which acoustic noise generated in the ceramic body 110 is transmitted to a board.

In the case in which at least a portion of the first and second solders 141 and 142 is disposed between an external electrode and an upper electrode, the acoustic noise generated in the ceramic body 110 may be further concentrated on an interposer. Thus, the acoustic noise may be further reduced.

Figure 3B:
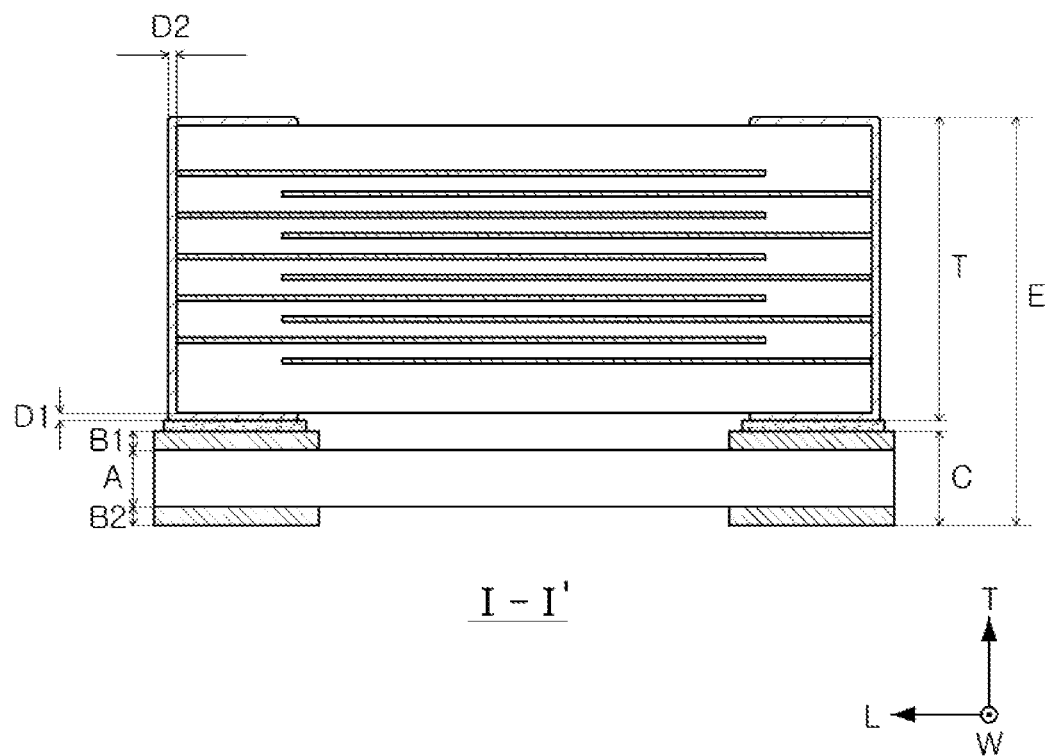
FIG. 3B is a cross-sectional illustrating dimensions of a multilayer ceramic electronic component according to an exemplary embodiment in the present disclosure.

FIG. 3B is a cross-sectional illustrating dimensions of a multilayer ceramic electronic component according to an exemplary embodiment in the present disclosure.

Referring to FIG. 3B, each of the first and second external electrodes 131 and 132 may have a lower portion thickness D1 and a length direction thickness D2. Each of the first and second terminal electrodes 221 and 222 may have an upper portion thickness B1 and a lower portion thickness B2. (B1+B2)/2 may be defined as B.

The insulating body 210 may include a typical insulating material, and the first and second terminal electrodes 221 and 222 may include the same material as the above-described first and second external electrodes 131 and 132. The typical insulating material may have a Young's modulus lower than a Young's modulus of the first and second terminal electrodes 131 and 132.

The interposers 200a and 200b may further reduce the acoustic noise of the ceramic body 110 as the Young's modulus thereof is increased.

Accordingly, the multilayer ceramic electronic component according to an exemplary embodiment may include first and second terminal electrodes 221 and 222 having a relatively great upper portion thickness B1 and/or a relatively great lower portion thickness B2, and may include an insulating body 210 having a relatively small thickness A or an interposer 200a and 200b having a relatively small thickness C.

More specifically, when a thickness of an upper portion of each of the terminal electrodes 221 and 222 disposed above the insulating body 210 is B1, a thickness of a lower portion of each of the terminal electrodes 221 and 222 disposed below the insulating body 210 is B2, a thickness of each of the interposers 200a and 200b is C, and a thickness of the insulating body 210 is A, (B1+B2)/2 may be greater than or equal to 10 μm and less than C/2, C may be greater than B1+B2 and less than or equal to 80 μm, and A may be 60 μm or less.

Accordingly, an effective Young's modulus of the interposer 200a and 200b may be increased and the acoustic noise of the ceramic body 110 may be reduced.

For example, when (B1+B2)/2 is B, B may be greater than or equal to 10 μm and less than or equal to 20 μm, C may be greater than or equal to 55 μm and less than or equal to 80 μm, and A may be greater than or equal to 15 μm and less than or equal to 60 μm.

As the thickness A of the insulating body 210 is decreased too much or the thickness C of each of the interposers 200a and 200b is decreased too far, strength of the interposers 200a and 200b may be reduced. According to the present embodiment, the reduction in strength of the interposers 200a and 200b may be prevented to reduce the acoustic noise.

An overall thickness E of the multilayer ceramic electronic components may not be great although the upper and lower portion thicknesses B1 and B2 of the first and second terminal electrodes 221 and 222 are great. Moreover, thinning and/or miniaturization of the multilayer ceramic electronic component may be easily implemented.

Accordingly, the thicknesses B1 and B2 of the first and second terminal electrodes 221 and 222 and the thickness A of the insulating body 210 are optimized, based on Tables (1), (2), and (3), such that the multilayer ceramic electronic component according to an exemplary embodiment may further reduce the acoustic noise. The insulating body 210 contains the most epoxy, and the first and second terminal electrodes 221 and 222 contain the most copper (Cu). For example, the insulating body 210 mainly contains epoxy and the first and second terminal electrodes 221 and 222 mainly contain copper (Cu).

Table (1) shows acoustic noise AN depending on an insulating body thickness A and an interposer thickness C when an average thickness B of an upper electrode thickness B1 and a lower electrode thickness B2 is 10 μm.

TABLE (1)

| A (μm) | AN (dB) | C (μm) | Note |
|---|---|---|---|
| 40 | 37.8 | 60 | A = 100 μm − (60/10) * B |
| 50 | 31.3 | 70 | A = 100 μm − (50/10) * B |
| 55 | 24.9 | 75 | A = 100 μm − (45/10) * B |
| 60 | 24.1 | 80 | A = 100 μm − (40/10) * B |
| 70 | 32.5 | 90 | A = 100 μm − (30/10) * B |
| 80 | 37.6 | 100 | A = 100 μm − (20/10) * B |

Table (2) shows acoustic noise AN depending on an insulating body thickness A and an interposer thickness C when an average thickness B of an upper electrode thickness B1 and a lower electrode thickness B2 is 15 μm.

TABLE (2)

| A (μm) | AN (dB) | C (μm) | Note |
|---|---|---|---|
| 20 | 34.9 | 50 | A = 100 μm − (80/15) * B |
| 30 | 28.9 | 60 | A = 100 μm − (70/15) * B |
| 35 | 22.2 | 65 | A = 100 μm − (65/15) * B |
| 40 | 21.8 | 70 | A = 100 μm − (60/15) * B |
| 50 | 29.3 | 80 | A = 100 μm − (50/15) * B |
| 60 | 34.3 | 90 | A = 100 μm − (40/15) * B |

Table (3) shows acoustic noise AN depending on an insulating body thickness A and an interposer thickness C when an average thickness B of an upper electrode thickness B1 and a lower electrode thickness B2 is 20 μm.

TABLE (3)

| A (μm) | AN (dB) | C (μm) | Note |
|---|---|---|---|
| 10 | 27.9 | 50 | A = 100 μm − (90/20) * B |
| 15 | 21.7 | 55 | A = 100 μm − (85/20) * B |
| 20 | 19.4 | 60 | A = 100 μm − (80/20) * B |
| 30 | 23.5 | 70 | A = 100 μm − (70/20) * B |
| 40 | 28.5 | 80 | A = 100 μm − (60/20) * B |
| 60 | 35.1 | 100 | A = 100 μm − (40/20) * B |

Referring to Table (1), when B is 10 μm, the acoustic noise AN may be most significantly reduced in the case in which A is 60 μm.

Referring to Table (2), when B is 15 μm, the acoustic noise AN may be most significantly reduced in the case in which A is 40 μm.

Referring to Table (3), when B is 20 μm, the acoustic noise AN may be most significantly reduced in the case in which A is 20 μm.

For example, when B is greater than or equal to 10 μm and less than or equal to 20 μm, an optimal point distribution trend of the acoustic noise AN may be expressed as an increase/decrease of A by 20 μm with an decrease/increase of B by 5 μm.

Accordingly, in the optimal point distribution trend, (4*B+A) may be a constant.

In the optimal point distribution trend, since A may be about 100 μm when B is zero (0), the constant may be about 100 μm.

Accordingly, the optimal point distribution trend may be similar to (4*B+A)=100 μm. A coefficient of B may be slightly smaller or slightly larger than 4.

For example, when B is greater than or equal to 10 μm or less than or equal to 20 μm, A may be greater than or equal to (100 μm−4.5B) or less than or equal to (100 μm−3.5B). Thus, the acoustic noise AN may be significantly reduced.

Referring to Tables (1) and (2), when B is 10 μm and A is 50 μm which is less than (100 μm−4.5B), the acoustic noise may be increased more significantly than when A is 55 μm which is (100 μm−4.5B). When B is 15 μm and A is 50 μm which is greater than (100 μm−4B), the acoustic noise AN may be increased more significantly than when A is 40 μm which is (100 μm−4B).

Accordingly, when B is satisfactory, to be greater than or equal to 10 μm and less than or equal to 15 μm and A is satisfactory to be greater than or equal to (100 μm−4.5B) and less than or equal to (100 μm−4B), a multilayer ceramic electronic component and an interposer according to an exemplary embodiment may significantly reduce the acoustic noise AN while decreasing in an overall thickness E.

Referring to Tables (2) and (3), when B is 15 μm and A is 30 μm which is less than (100 μm−13B/3), the acoustic noise may be increased more significantly than when A is 35 μm which is (100 μm−13B/3). When B is 20 μm and A is 40 μm which is greater than (100 μm−3.5B), the acoustic noise AN may be increased more significantly than when A is 30 μm which is (100 μm−3.5B).

Accordingly, when B is satisfactory to be greater than or equal to 15 μm and less than or equal to 20 μm and A is satisfactory to be greater than or equal to (100 μm−13B/3) and less than or equal to (100 μm−3.5B), the multilayer ceramic electronic component and the interposer according to an exemplary embodiment may significantly reduce the acoustic noise AN while decreasing in an overall thickness E.

Referring to Tables (1), (2), and (3), when B is greater than or equal to one-sixth (1/6) times A or less than or equal to four-thirds (4/3) times A, the multilayer ceramic electronic component and the interposer according to an exemplary embodiment may significantly reduce the acoustic noise AN while decreasing in an overall thickness E.

Referring to Tables (1), (2), and (3), when A is greater than or equal to three-elevenths (3/11) times the interposer thickness C or less than or equal to eleven-fifths (11/15) times C, the multilayer ceramic electronic component and the interposer according to an exemplary embodiment may significantly reduce the acoustic noise AN while decreasing in an overall thickness E.

Depending on a design, an average value (B1+B2)/2 of thicknesses B1 and B2 of sides of the first and second terminal electrodes 221 and 222, upper and lower than the insulating body 210, may be greater than a thickness D1 of a side of each of the first and second external electrodes 131 and 132, lower than the ceramic body 110.

The acoustic noise generated in the ceramic body 110 may be transmitted to the first and second terminal electrodes 221 and 222 through lower portions of the first and second external electrodes 131 and 132.

In this case, since the first and second terminal electrodes 221 and 222 have thicknesses greater than thicknesses of the first and second external electrodes 131 and 132, the first and second terminal electrodes 221 and 222 may act as a relatively high-rigidity structure from the viewpoint of the first and second external electrodes 131 and 132.

Accordingly, the interposers 200a and 200b may significantly attenuate acoustic noise by efficiently using a high Young's modulus of the first and second terminal electrodes 221 and 222.

As a result, the multilayer ceramic electronic component according to an exemplary embodiment may increase an effective Young's modulus of the interposers 200a and 200b to significantly reduce the acoustic noise of the ceramic body 110.

Referring to FIG. 3B, an overall thickness E of a multilayer ceramic electronic component according to an exemplary embodiment may be the sum of an overall thickness T of a multilayer ceramic capacitor, a thickness C of an interposer, and a thickness of the solder therebetween, but may vary depending on a design.

Figure 4A:
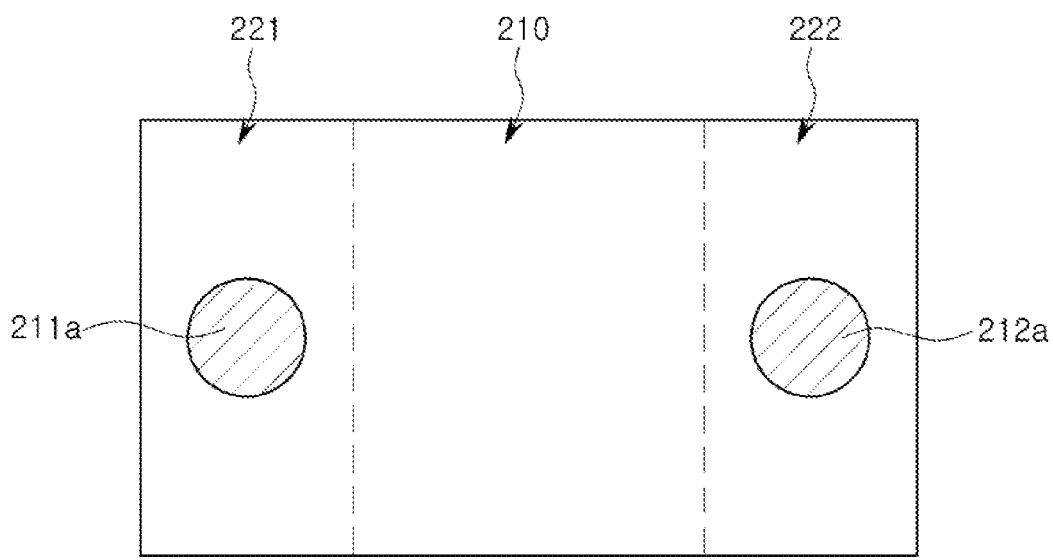
FIGS. 4A to 4C are plan views illustrating various shapes of an interposer included in a multilayer ceramic electronic component according to an exemplary embodiment in the present disclosure.
Figure 4A:
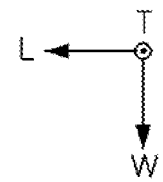
Figure 4B:
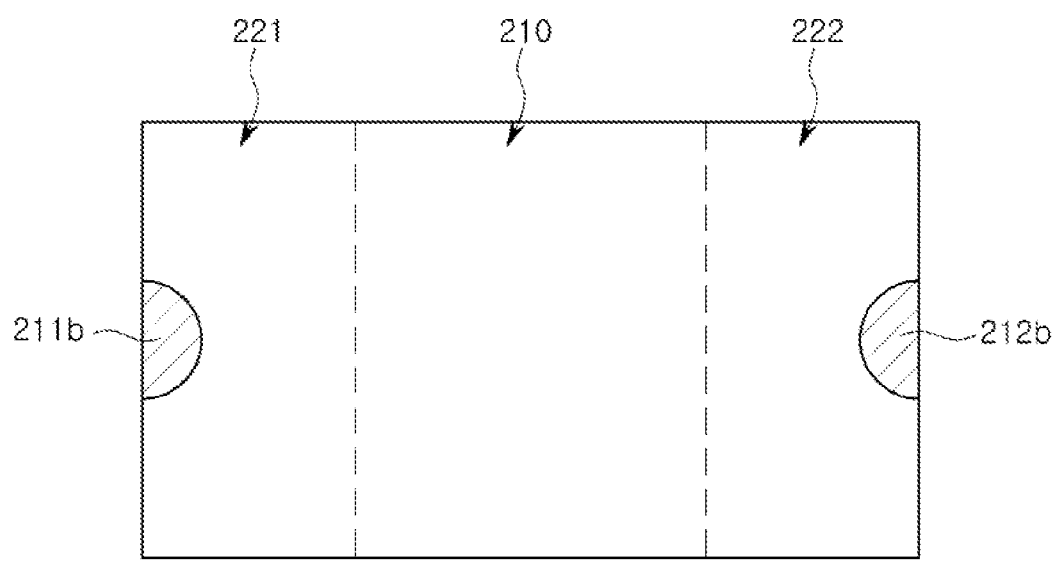
Figure 4C:
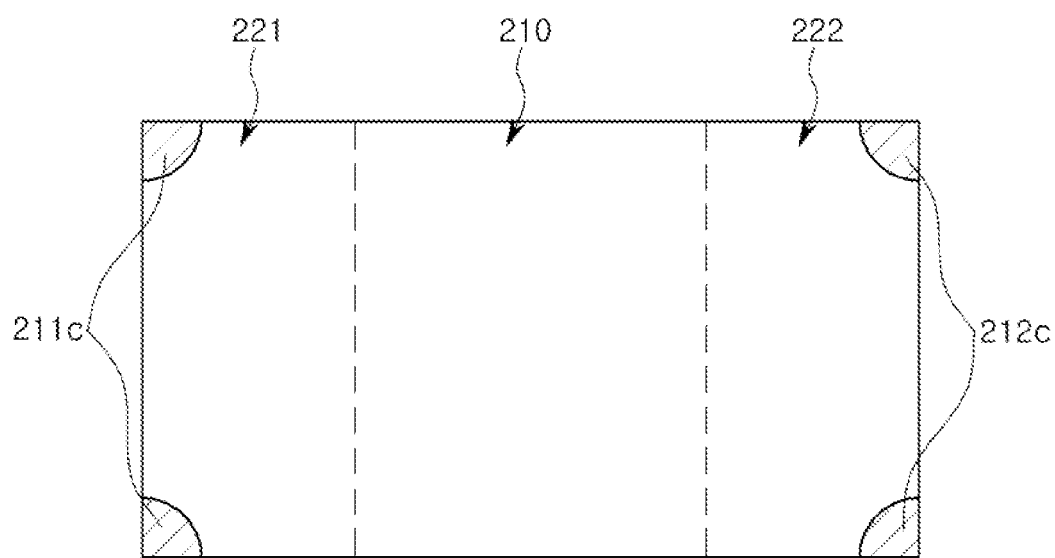

FIGS. 4A to 4C are plan views illustrating various shapes of an interposer included in a multilayer ceramic electronic component according to an exemplary embodiment in the present disclosure.

Referring to FIGS. 4A to 4C, interposers 200c, 200d, and 200e included in a multilayer ceramic electronic component according to an exemplary embodiment may further include first vias 211a, 211b, and 211c formed to electrically connect a first upper electrode and a second lower electrode to each other, and second vias 212a, 212b, and 212c formed to electrically connect a second upper electrode and a second lower electrode to each other.

Referring to FIG. 4A, first and second vias 211a and 212a may be disposed in an insulating body 210 in the form of circular through-holes.

Referring to FIG. 4B, first and second vias 211b and 212b may be disposed one end and the other end of an insulating body 210 in a length direction in the form of semicircles.

Referring to FIG. 4C, first and second vias 211c and 212c may be disposed at corners of an insulating body 210 in the form of quadrants.

As described above, a multilayer ceramic electronic component according to an exemplary embodiment and an interposer included in the multilayer ceramic electronic component may reduce acoustic noise and may be easily miniaturized and/or thinned depending on a design.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
a ceramic body including dielectric layers and first and second internal electrodes laminated with each of the dielectric layers interposed therebetween and alternately exposed to first and second external surfaces of the ceramic body;
first and second external electrodes disposed on the first and second external surfaces of the ceramic body to be connected to the first and second internal electrodes, respectively; and
an interposer, including an insulating body, disposed below the ceramic body, and first and second terminal electrodes having an upper portion disposed between the insulating body and the first and second external electrodes and a lower portion disposed on a lower surface of the insulating body, respectively, wherein (B1+B2)/2 is greater than or equal to 10 micrometers (μm) and less than C/2, and C is greater than (B1+B2) and less than or equal to 80 μm, in which B1 is a thickness of the upper portion of each of the first and second terminal electrodes, B2 is a thickness of the lower portion of each of the first and second terminal electrodes, and C is a thickness of the interposer, C is greater than or equal to 55 μm and less than or equal to 80 μm, B, equal to (B1+B2)/2, is greater than or equal to 10 μm and less than or equal to 15 μm, and A is greater than or equal to (100 μm−4.5B) and less than or equal to (100 μm−4B), in which A is a thickness of the insulating body.

2. The multilayer ceramic electronic component of claim 1, wherein the upper portion and the lower portion are connected to each other by a connection portion on a side surface of the insulating body or by a via passing the insulating body.

3. The multilayer ceramic electronic component of claim 1, further comprising:
   a first solder having at least a portion disposed between the upper portion of the first terminal electrode and the first external electrode, the first solder spaced apart from the lower portion of the first terminal electrode; and
   a second solder having at least a portion disposed between the upper portion of the second terminal electrode and the second external electrode, the second solder spaced apart from the lower portion of the second terminal electrode.

4. The multilayer ceramic electronic component of claim 1, wherein the insulating body mainly contains epoxy,
   the upper portion mainly contains copper (Cu), and
   the lower portion mainly contains copper (Cu).

5. An interposer comprising:
   an insulating body;
   first and second upper electrodes disposed on an upper side of the insulating body; and
   first and second lower electrodes disposed on a lower surface of the insulating body,
   wherein B is (B1+B2)/2 and is greater than or equal to 10 micrometers (μm) and less than or equal to 20 μm, and A is greater than or equal to 15 μm and less than or equal to 60 μm, in which A is a thickness of the insulating body, B1 is a thickness of each of the first and second upper electrodes is B1, and B2 is a thickness of each of the first and second lower electrodes, and
   wherein B is satisfactory to be less than or equal to 15 μm, and A is satisfactory to be greater than equal to (100 μm−4.5B) and less than or equal to (100 μm−4B).

6. The interposer of claim 5, wherein A is satisfactory to be greater than equal to (100 μm−13B/3).

7. The interposer of claim 5, wherein the insulating body mainly contains epoxy,
   the first and second upper electrodes mainly contain copper (Cu), and
   the first and second lower electrodes mainly contain copper (Cu).

8. The interposer of claim 5, wherein the first upper electrode and the first lower electrode are connected to each other by a first connection portion on one side surface of the insulating body or by a first via passing the insulating body, and
   the second upper electrode and the second lower electrode are connected to each other by a second connection portion on another side surface of the insulating body or by a second via passing the insulating body.

9. A multilayer ceramic electronic component comprising:
   a ceramic body including dielectric layers and first and second internal electrodes laminated with each of the dielectric layers interposed therebetween arid alternately exposed to first and second external surfaces of the ceramic body;
   first and second external electrodes disposed on the first and second external surfaces of the ceramic body to be connected to the first and second internal electrodes, respectively; and
   an interposer, including an insulating body, disposed below the ceramic body, and first and second terminal electrodes having an upper portion disposed between the insulating body and the first and second external electrodes and a lower portion disposed on a lower surface of the insulating body, respectively,
   wherein A is greater than or equal to (100 μm−4.5B) and less than or equal to (100 μm−4B), in which A is a thickness of the insulating body and B is an average thickness of the upper portion of each of the first and second terminal electrodes and the lower portion of each of the first and second terminal electrodes, and
   B is greater than or equal to 10 μm and less than or equal to 15 μm.

10. The multilayer ceramic electronic component of claim 9, wherein the upper portion and the lower portion are connected to each other by a connection portion on a side surface of the insulating body or by a via passing the insulating body.

11. The multilayer ceramic electronic component of claim 9, wherein the insulating body mainly contains epoxy, and the upper and lower portions mainly contain copper (Cu).

* * * * *